United States Patent [19]
Harvey

[11] Patent Number: 5,420,542
[45] Date of Patent: May 30, 1995

[54] VARACTOR COMPENSATION IN AMPLIFIER CIRCUITS

[75] Inventor: Barry Harvey, Los Altos, Calif.

[73] Assignee: Elantec, Inc., Milpitas, Calif.

[21] Appl. No.: 242,946

[22] Filed: May 16, 1994

[51] Int. Cl.⁶ .......................... H03F 1/14; H03F 3/45
[52] U.S. Cl. .................................. 330/292; 330/252; 330/260; 330/265
[58] Field of Search ................... 330/76, 77, 156, 252, 330/260, 265, 292

[56] References Cited

U.S. PATENT DOCUMENTS 4,713,628  12/1987  Nelson ............................ 330/252 X
4,751,474   6/1988  Gola ................................. 330/292
4,885,548  12/1989  Wakimoto et al. ............. 330/292 X

*Primary Examiner*—James B. Mullins
*Attorney, Agent, or Firm*—Leo V. Novakoski

[57] ABSTRACT

A scheme is presented for offsetting varactor error currents that are coupled to the gain nodes of amplifier circuits through transistors having their collectors connected to these gain nodes. For each vatactor error current generating transistor, a compensating diode circuit is connected so as to replicate the vatactor error current, and the replicated current is coupled to the gain node to offset the vatactor error current of the corresponding transistor. In order to replicate the vatactor error current of a given transistor, each compensating diode circuit comprises a diode for which the capacitance and the voltage dependence thereof substantially track those of the collector-base junction of the corresponding transistor. The voltage driving the vatactor error current in the transistor is coupled to one electrode of the compensating diode, the other electrode of which is connected to the emitter of the transistor having its collector connected to the gain node. The replicated error current generated in the compensating diode circuit thus formed is coupled to the emitter of the transistor having its collector connected to the gain node to offset the vatactor error current of the corresponding transistor. Amplifier circuits in which this scheme is implemented are also disclosed.

13 Claims, 3 Drawing Sheets

VARACTOR COMPENSATION IN AMPLIFIER CIRCUITS

BACKGROUND OF THE INVENTION

1. Field of the Invention

This invention relates to amplifier circuits and in particular to amplifier circuits which include diode compensation circuits to improve the amplifier characteristics by offsetting varactor error currents within the amplifier circuit.

2. Description of the Related Art

In amplifiers, the collector-base capacitances ($C_{BC}$) of certain component transistors are connected in parallel with compensation devices and, consequently, effect the frequency response of the amplifier. To the extent these $C_{BC}$s are known, their impact can be reduced by adjusting the size of the compensation device accordingly. However, the $C_{BC}$ of a transistor varies with voltage changes across the collector-base junction as occur, for example, when the voltage at the base or collector of the transistor is driven by a time-dependent input signal. In this case, the collector current of the transistor includes a varactor error current due to variations in $C_{BC}$ with voltage, in addition to the current component generated by true transistor action.

For example, the current into a node that includes a voltage dependent capacitance is related to the voltage change at the node as follows:

$$(Eq.\ 1)\ I = d(CV)/dt + V(dC/dV)dV/dt.$$

Here, $V(dC/dV)\ dV/dt$ represents the varactor error current, which is a function of the node voltage, $V$. For example, $dC/dV$ varies as $V^{-3/2}$ for a step graded junction, producing a voltage dependent error current that varies as $V^{-\frac{1}{2}}$.

Varactor error currents are significant where the current represented by Eq. 1 is coupled to the gain node of the amplifier circuit. For example, varactor error currents cause the bandwidth and stability of an amplifier to change with the supply voltage, and processing variations in the $C_{BC}$s of transistors contribute errors that cannot be offset by conventional compensation schemes. Further, the bandwidth and stability of an amplifier will vary with signal voltages, leading to high frequency distortion, differential gain errors, and differential phase errors. Because of their dynamic nature, these error currents are difficult to offset.

Attempts have been made to offset the impact of varactor error currents on the performance of amplifier circuits. For example, in the neutralization method the average value of a varactor error current at a gain node is estimated, and an inverted version of this average varactor error current is generated and fed back into the gain node to offset the actual varactor error current. Because the correction signal is only a steady state approximation and does not reflect the dynamic voltage dependence of the varactor error currents, only partial compensation is achieved.

SUMMARY OF THE INVENTION

The present invention includes a scheme for canceling varactor errors in amplifier circuits and certain amplifier circuits embodying this scheme. In accordance with the present invention, the transistors in an amplifier circuit that contribute varactor error currents to the gain node of the amplifier are identified. The varactor error current generated by the $C_{BC}$ of each transistor thus identified is replicated in a compensation circuit and fed back to the gain node in a manner that cancels the original varactor error current. By actually replicating the varactor error current for each transistor that produces an error current the scheme of the present invention provides compensation against varactor errors over the entire range of node voltages present in the amplifier.

The varactor error current produced by a varactor error current-generating transistor is replicated by a compensating diode circuit that includes a compensation diode selected to reproduce both the magnitude and voltage dependence of the $C_{BC}$ of the corresponding error-generating transistor. The compensation diode circuit is connected so that a voltage identical to that applied to the $C_{BC}$ of the error-generating transistor is applied across the compensating diode to replicate the error current, and this replicated error current is coupled to the error-generating transistor in a manner that negates the varactor error current. This is accomplished by coupling the node voltage that generates the varactor error current in the error-generating transistor, i.e. the voltage at the node to which the base or collector of the error-generating transistor is coupled, to the corresponding electrode of the compensating diode through a buffer. The remaining electrode of the compensation diode is coupled to a current path into the gain node so that current generated in the compensating diode circuit negates the varactor error current to the gain node produced by the error-generating transistor.

With this configuration, any variation in the node voltage that produces a varactor error current coupled to the gain node also generates a replica of the varactor error current in the corresponding compensation diode circuit. Since the compensation provided is dynamically generated by the same node voltage responsible for the varactor error currents in the errorgenerating transistors, cancellation of the varactor error current by the compensation current is substantially complete.

An amplifier in which the scheme of the present invention is implemented comprises a differential input stage, an output buffer having a compensating capacitor at its input, a gain stage, and a diode compensation circuit. The gain stage comprises first and second transistors configured as a current mirror with the collectors of the first and second transistors forming an input and output, respectively, for the current mirror. The current mirror input and output are coupled to the collectors of first and second biased transistors, the emitters of which are driven by the outputs of the differential input stage. The input of the output buffer is connected to the gain node formed by the common connection of the collectors of the second transistor of the current mirror and the second biased transistors.

The second current mirror and biased transistors each contribute varactor error currents to the gain node as their collectors are driven by the gain node voltage. The compensation circuit for offsetting these error currents comprises a second buffer and first and second compensation diodes selected to match the $C_{BC}$s of the second current mirror transistor and second biased transistor, respectively. Each compensation diode is connected so that the second buffer couples the gain node voltage applied to the $C_{BC}$ of its corresponding transistor to the appropriate diode electrode. The other electrodes of the first and second compensating diodes are connected to the emitters of the second current mirror transistor and biased transistor, respectively, so that any change in the current to the gain node of the amplifier due to vatactor error currents in these transistors is replicated in the corresponding compensating diode and coupled back to the gain node in an inverted sense, negating the original varactor error current.

In one embodiment of the amplifier circuit, the first compensating diode is selected to have twice the $C_{BC}$ of the current mirror transistor, since this transistor contributes a second varactor error current to the gain node by virtue of its coupling to the first transistor of the current mirror.

Other amplifier circuits incorporating varactor compensation schemes in accordance with the present invention are also disclosed.

DETAILED DESCRIPTION OF THE INVENTION

Figure 1A:
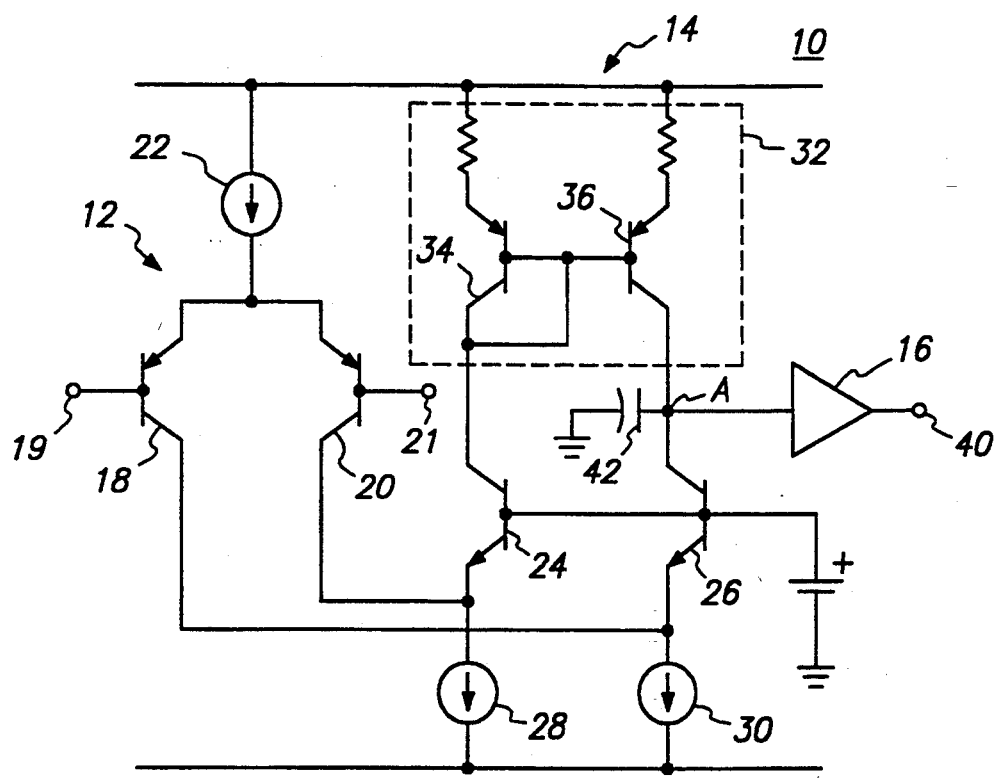
FIG. 1A and 1B are schematic diagrams of conventional amplifier circuits.

Referring to FIG. 1A, there is shown a conventional amplifier circuit 10, including a differential input stage 12, a gain stage 14, and an output buffer 16. Differential input stage 12 includes differentially connected input transistors 18, 20, the bases of which form differential inputs 19, 21 and the emitters of which are connected to current source 22 which provides bias current to input stage 12.

Gain stage 14 includes a pair of biased transistors 24, 26 having current sources 28, 30, respectively, coupled to their emitters. A current mirror 32 comprises first and second current mirror transistors 34 and 36, the collectors of which are connected to the collectors of biased transistors 24, 26, respectively. The common connection of the collectors of bias transistor 26 and second current mirror transistor 36 forms gain node A which is coupled to ground through capacitor 42. Buffer 16 has an input connected to gain node A and an output which forms an output 40 of amplifier circuit 10. An input voltage applied between inputs 19, 21 of differential input stage 12 generates a difference between currents flowing from the collectors of first and second current mirror transistors 34, 36 to biased transistors 24, 26, respectively, which charges and discharges capacitor 42.

The frequency response of gain node A is determined by the sum of the capacitances at gain node A. Here, the base collector junction capacitances ($C_{BC}$) of bias transistor 26 and second current mirror transistor 36 as well as capacitor 42 contribute to the capacitance at gain node A. Thus, as the voltage at gain node A changes, the $C_{BC}$s of second current mirror transistor 36 and biased transistor 26 each contribute a varactor error current to gain node A in accordance with Eq. 1. Moreover, the $C_{BC}$ of output transistor 36 contributes two varactor current errors since the base current of second current mirror transistor 36 flows into input transistor 34 of current mirror 32. In addition, input transistors 18, 20 contribute vatactor error currents to node A as their bases are driven by the voltage applied between inputs 19, 21, and transistors in output buffer 16 contribute varactor error currents that are driven by the voltage at gain node A.

Figure 1B:
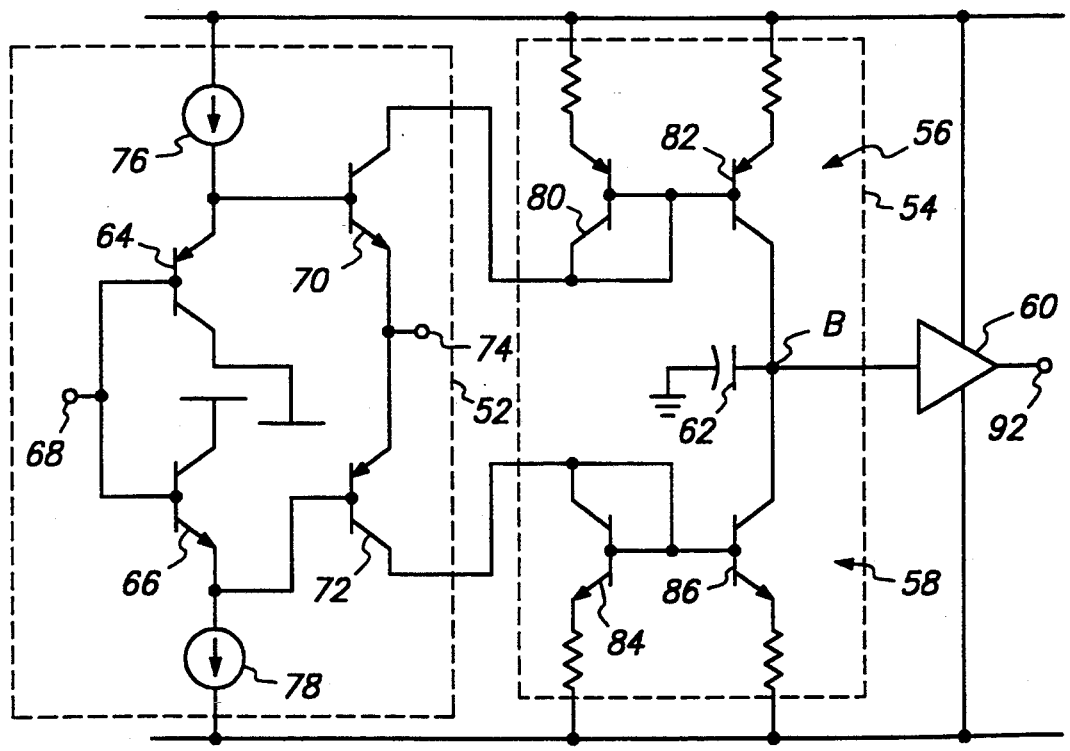

Referring now to FIG. 1B, there is shown a conventional current feedback amplifier circuit 50, including an input stage 52, a gain stage 54 comprising a pair of complementary current mirrors 56, 58 and a compensation capacitor 62, and an output buffer 60. Input stage 52 comprises a first pair of complementary input transistors 64, 66, the bases of which are connected together to form an input 68. The bases of a second pair of complementary input transistors 70, 72 are connected to the emitters of first transistors 64, 66, respectively, and their emitters are connected to form an inverting input 74. A pair of current sources 76, 78 are connected to the emitters of first transistors 64, 66, respectively, to provide bias current to first and second pairs of input transistors 64, 66 and 70, 72, respectively.

Complementary current mirrors 56, 58 of gain stage 54 each comprise an input transistor 80, 84, respectively, and an output transistor 82, 86, respectively. The collectors of input transistors 80, 84 are connected to the collectors of second input transistors 70, 72, respectively, and the collectors of complementary output transistors 82, 86 are connected together, forming gain node B of amplifier circuit 50. Compensating capacitor 62 is connected between gain node B and ground, and output buffer 60 has an input connected to gain node B and an output forming output 92 of amplifier circuit 50.

As in amplifier circuit 10, amplifier circuit 50 is subject to varactor error currents from a number of different sources. For example, the voltage at input 68 generates varactor error currents in second pair of transistors 70, 72 which are coupled directly to gain node B through current mirrors 56, 58. Complementary output transistors 82, 86 also contribute varactor errors to gain node B as do transistors in output buffer 60.

Figure 2:
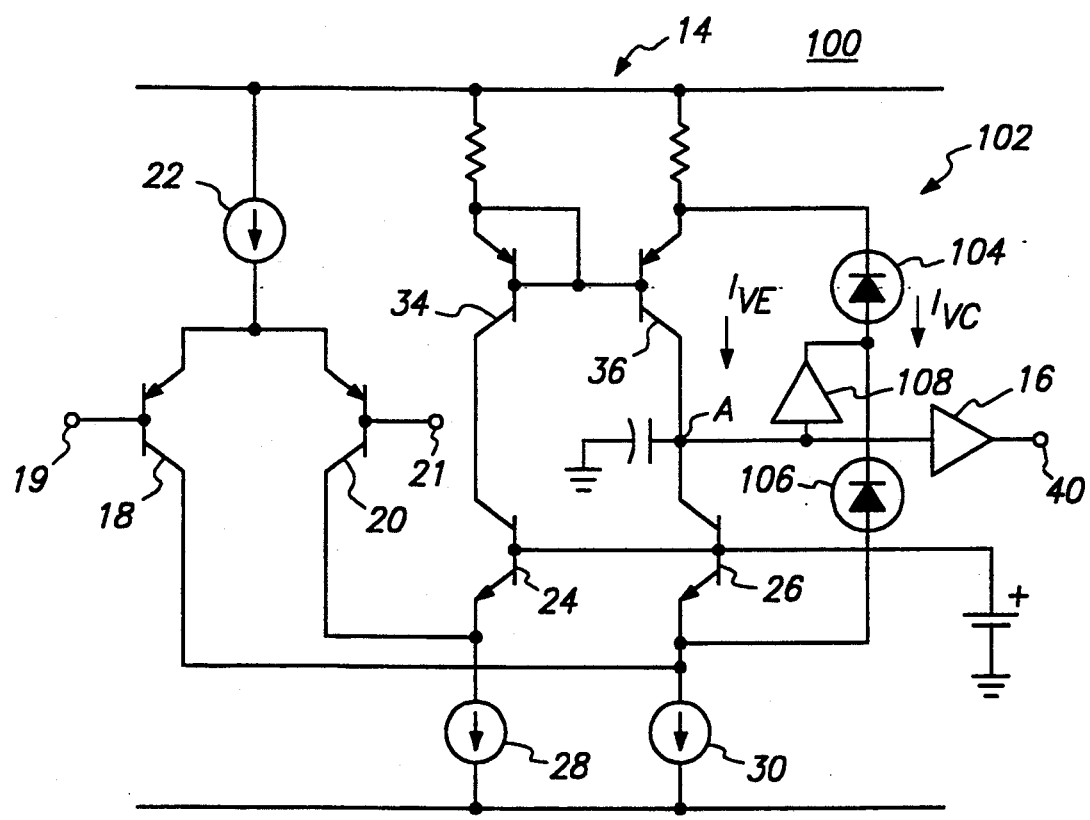
FIG. 2 is a schematic diagram of an amplifier circuit in accordance with the present invention including compensating diode circuits to offset varactor error currents.

Referring now to FIG. 2, there is shown an amplifier circuit 100 in accordance with the present invention. Where the elements of amplifier circuit 100 are the same as those in amplifier circuit 10 of FIG. 1A, the same reference numbers are used. In addition to the elements designated in FIG. 1A, amplifier circuit 100 of FIG. 2 includes a compensating diode circuit 102 comprising compensation diodes 104, 106 and a second buffer 108. Buffer 108 has an input coupled to gain node A and an output coupled to one electrode each of compensating diodes 104, 106. The remaining electrode of compensating diode 104 is connected to the emitter of second current mirror transistor 36, and the remaining electrode of compensating diode 106 is connected to the emitter of biased transistor 26. In order to match the properties of their corresponding transistors, compensating diodes 104, 106 may be provided by transistors that are identical to second current mirror transistor 36 and biased transistor 26, respectively, and that have their emitters shorted to their bases.

With the configuration shown in FIG. 2, second buffer 108 drives diodes 104, 106 with the same voltage as is applied to the base-collector junctions of second current mirror transistor 36 and biased transistor 26 by gain node A. As a result, a current, $I_{vc}$, is generated in compensating diode circuit 102 which is identical to the varactor error current, $I_{ve}$, coupled to gain node A by second current mirror transistor 36 and biased transistor 26. In effect, an inverted $I_{ve}$ ($I_{vc}$) is coupled back to gain node A through the emitters of second current mirror transistor 36 and biased transistor 26 to offset $I_{ve}$, eliminating errors in the voltage at gain node A attributable to varactor error currents. Since $I_{vc}$ is generated dynamically from the gain node voltage through second buffer 108, it matches $I_{ve}$ over the entire range of output voltages.

Figure 3:
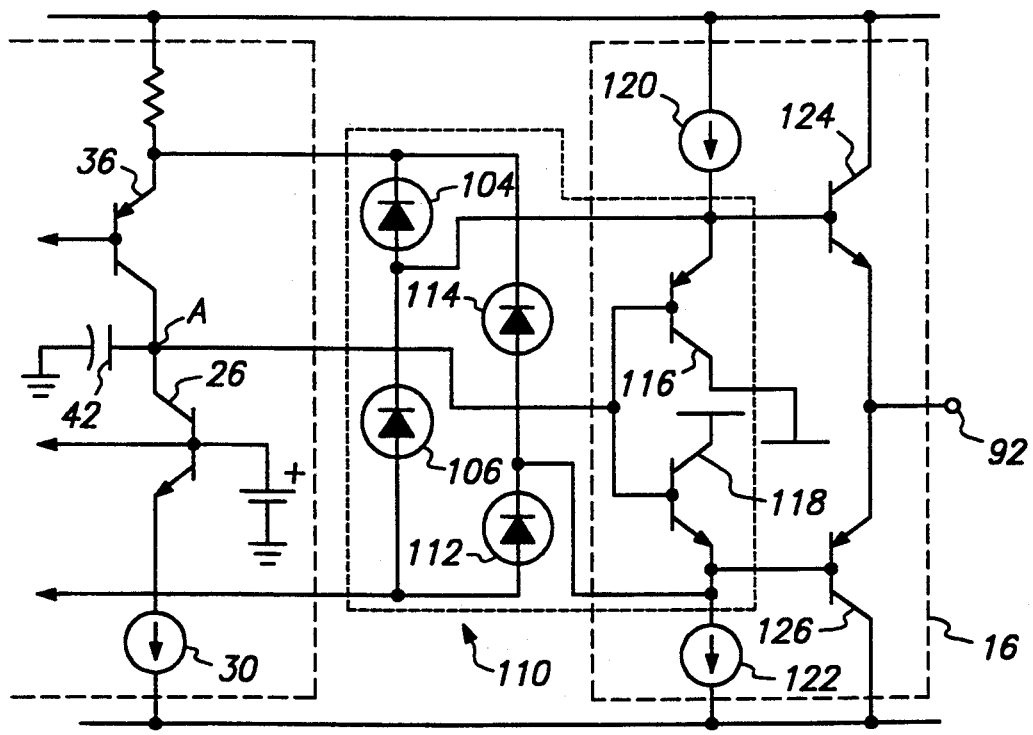
FIG. 3 is a schematic diagram of the output buffer in an amplifier circuit that includes a compensating diode circuit in accordance with the present invention for offsetting varactor error currents due to output buffer transistors.

Referring now to FIG. 3, there is shown a detailed schematic of a portion of amplifier circuit 10, one embodiment of output buffer 16, and a compensating diode circuit 110 for offsetting varactor error currents due to output buffer 16 as well as those due to second current mirror transistor 36 and biased transistor 26. Compensating diode circuit 110 includes compensating diodes 112, 114, in addition to compensating diodes 104, 106 for offsetting varactor error currents as discussed in conjunction with FIG. 2. In the configuration shown, compensating diodes 104, 106, 112, and 114 replicate varactor error currents generated by transistors 36, 26, 116, and 118.

In compensating diode circuit 110, first buffer transistors 116, 118 also operate as emitter followers to couple the voltage at gain node A to diodes 104, 106 and 112, 114, respectively. This obviates the need for a separate second buffer 108 as is used in compensating diode circuit 102. A second buffer could be used to drive diodes 104, 106, 112, 114 with a replica of the gain node voltage, but this would introduce additional varactor errors which would have to be offset by appropriate circuitry.

Compensating diode circuit 110 is shown with diodes 104, 106 being driven by the emitter of buffer transistor 116. However, the emitter of buffer transistor 118 may also be used for this purpose. The choice should be determined by which of buffer transistors 116, 118 produces a buffered emitter voltage that, when applied to the compensating diode, produces a voltage equivalent to that across the $C_{BC}$ junction being compensated.

Figure 4:
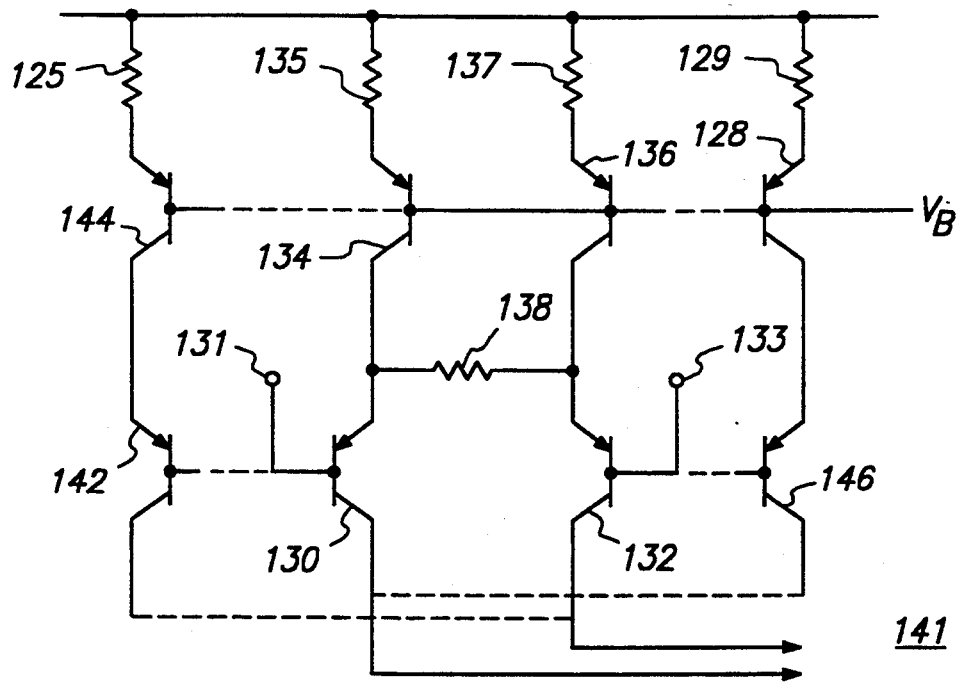
FIG. 4 is a schematic diagram of a differential input stage of an amplifier circuit which includes compensating diode circuit in accordance with the present invention for offsetting varactor error currents due to transistors in the input stage.

Referring now to FIG. 4, there is shown a schematic diagram of a differential input stage 141 comprising differentially connected input transistors 130, 132, the bases of which form inputs 131, 133. Current source transistors 134, 136 are connected to the emitters of input transistors 130, 132, respectively, to provide bias current in accordance with bias voltage, $V_B$, and the magnitude of current setting resistors 125, 129, 135, 137. Resistor 138 is connected between the emitters of input transistors 130, 132 to limit the signal current generated by input stage 120. First and second compensating transistor pairs 142, 144 and 146, 128 have been added to input stage 141 to offset varactor errors driven by a voltage applied between inputs 131, 133. Compensating transistor pair 142, 124 is connected in parallel with current source transistor 134 and input transistor 130 up to the base of compensating transistor 142, the collector of which is cross-connected to the collector of input transistor 132. Similar connections are made between compensating transistor pair 146, 128, input transistor 132, current source transistor 136 and the collector of input transistor 130.

With this configuration, the voltage applied between inputs 131, 133 drives collector-base junctions in input transistors 130, 132 and compensating transistors 142, 146, producing varactor error currents in each transistor. For well matched input and compensation transistors 130, 142, respectively, and 132, 146, respectively, the varactor error currents will be substantially equal. The differential structure of input stage 141 obviates the need to couple varactor error currents from compensation transistors 142, 146 to the emitters of corresponding input transistors 130, 132. Instead, the collectors of compensation transistors 142, 146 are cross-connected with the collectors of differentially connected input transistors 130, 132 so that offset is provided in the differential signal generated from the collector currents of input transistors 130, 132.

The scheme employed to compensate amplifier circuit 10 for various sources of varactor error currents is applicable to most amplifier circuits. In each instance, transistors contributing a varactor error current to the gain node and the amplifier circuit node providing the voltage which drives the varactor error current are identified. For each transistor thus identified, a compensating diode is selected which has a junction capacitance that substantially matches the magnitude and voltage dependence of the $C_{BC}$ of the identified transistor. The compensating diode is connected so that the voltage applied across its collector-base junction is identical with the voltage applied across the collector-base junction of its corresponding identified transistor. For this purpose, the node voltage driving the identified transistor is coupled to the corresponding electrode of the compensating diode. The remaining electrode of the compensating diode is coupled to the gain node at a circuit point where the replicated varactor error current negates the varactor error current of the identified transistor. In amplifier circuits having a gain node formed by the collectors of complementary transistors, the electrode of the compensating diode is connected to the emitter of the transistor that has the same conductivity type as the identified error-generating transistor. With this configuration, the replicated vatactor error current generated by the compensating diode circuit offsets the varactor error current generated by the corresponding identified transistors.

Figure 5:
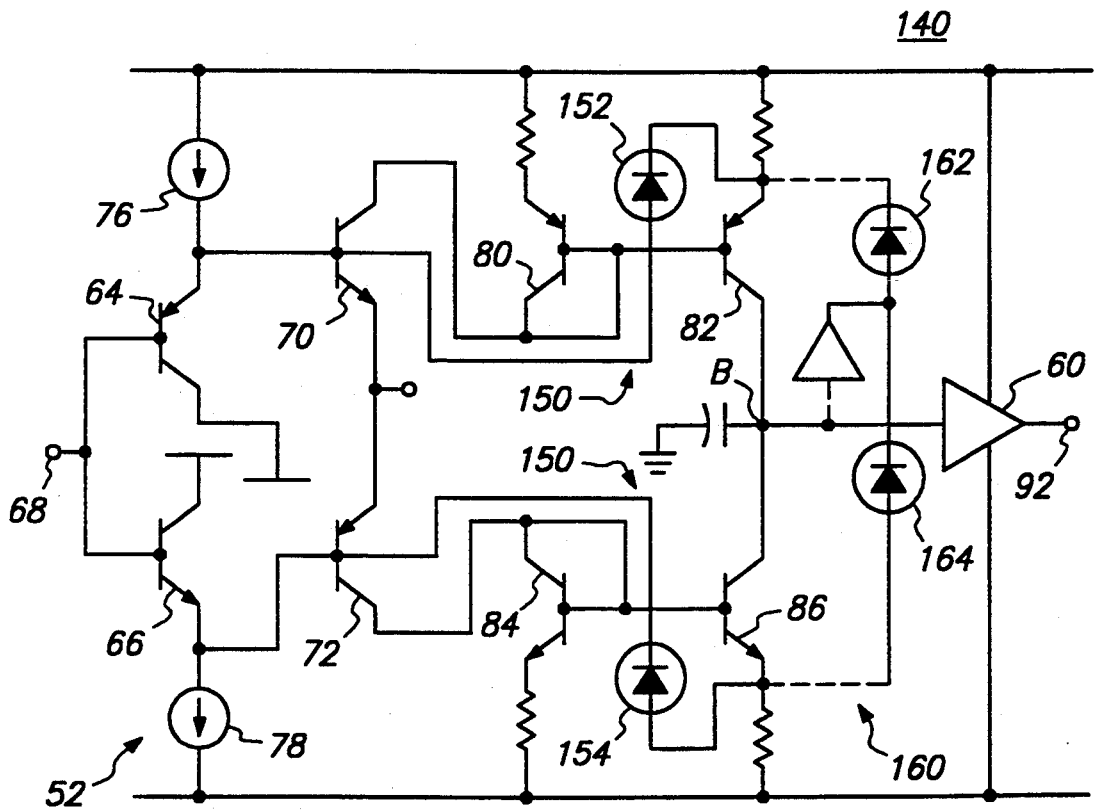
FIG. 5 is a schematic diagram of a current feedback amplifier in which compensating diode circuits in accordance with the present invention are included to offset varactor errors due transistors in both the input and output stages.

Referring now to FIG. 5, there is shown a current feedback amplifier circuit 140 in accordance with the present invention, including compensation diode circuits 150 and 160 to correct for varactor error currents generated by second input transistor pair 70, 72 and complementary current mirror transistors 82, 86, respectively, the collectors of which form gain node B. Where elements in current feedback amplifier circuit 140 are identical to those in amplifier circuit 50 of FIG. 1B, the same reference numbers are used.

First compensation diode circuit 150 replicates varactor error currents generated in second pair of input transistors 70, 72, by the input voltage that is coupled to their bases through first pair of input transistors 64, 66, respectively. Compensation diode circuit 150 comprises a first diode 152 connected between the base of second input transistor 70 and the emitter of current mirror transistor 82 and a second diode 154 connected between the base of second input transistor 72 and the emitter of current mirror transistor 86. First pair of input transistors 64, 66 thus buffers the input voltage that drives varactor error currents in second input transistors 70, 72, and replicated varactor error currents in compensation diodes 52, 154.

With this configuration, the voltages applied to first and second diodes 152, 154 are identical to those driving the base-collector junctions of second input transistors 70, 72, respectively, with the negative electrode of first diode 152 a diode drop above the collector of second input transistor 70 and the positive electrode of second diode 154 a diode drop below the collector of second input transistor 72. These differences in the voltages across diodes 152, 154 and their corresponding transistors 70, 72 may be compensated by appropriate choice of the capacitances of diodes 152, 154 so that varactor error currents generated by second input transistors 80, 82 are offset at gain node B by varactor correction currents coupled to gain node B through current mirror transistors 82, 86 by first and second diodes 152, 154, respectively.

Diode compensation circuit 160 of FIG. 5 is connected to gain node B in manner analogous to the connection between diode compensation circuit 102 and gain node A of amplifier circuit 100, and consequently operates in a similar manner. Thus, compensation diodes 162 and 164 negate varactor error currents in gain node B that are generated by driving the $C_{BCS}$ of output transistors 82, 86, with the voltage at gain node B. Likewise, a diode compensation circuit 110 may be employed with current feedback amplifier 140 to compensate for varactor errors generated by output transistors 80, 82 and transistors in output buffer 60.

Therefore, a scheme is presented for canceling varactor error currents in amplifier circuits by replicating the error currents generated by component transistors in compensating diode circuits and coupling the resulting compensating currents back to the amplifier gain node. Also presented are amplifier circuits 100, 140 in which the scheme of the present invention is implemented to cancel varactor error currents generated by transistors at the gain node, the output buffer, and the input stage.

What is claimed is:

1. A method for offsetting varactor error currents that are coupled to the gain node of an amplifier circuit in which the gain node is formed by the collectors of a pair of complementary transistors, the method comprising the steps of:
   identifying each transistor in the amplifier circuit that contributes a varactor error current to the gain node and a corresponding voltage node of the amplifier circuit that drives the varactor error current of the identified transistor;
   selecting for each identified transistor a compensating diode such that the capacitance and voltage dependence of the compensating diode are substantially identical to those of the collector-base junction capacitance of the corresponding identified transistor;
   coupling a first terminal of each compensating diode to the voltage node that drives the varactor error current in the corresponding identified transistor, to replicate the varactor error current of the corresponding identified transistor in the compensating diode; and
   coupling a second terminal of each compensating diode to an emitter of one of the complementary transistors that form the gain node at their collectors so that the varactor error current replicated by the compensating diode is coupled to the gain node in a manner that offsets the varactor error current coupled to the gain node by the corresponding identified transistor.

2. The method of claim 1, wherein the step of identifying the transistors that contribute varactor error currents to the gain node includes identifying each transistor having a collector connected to the gain node of the amplifier circuit.

3. The method of claim 2, wherein the step of identifying the transistors that contribute varactor error currents to the gain node further includes identifying each transistor having a base coupled to the gain node of the amplifier circuit.

4. The method of claim 3, wherein the step of identifying the transistors that contribute varactor error currents to the gain node further includes identifying each transistor having a base coupled to the input of the amplifier circuit.

5. The method of claim 1 wherein the step of selecting a compensating diode for each identified transistor includes selecting a compensating transistor identical to the corresponding identified transistor and connecting the emitter and base of the compensating transistor to form a compensating diode having a collector-base junction which substantially tracks the magnitude and voltage dependence of the capacitance of the collector-base junction of the corresponding identified transistor.

6. An amplifier circuit compensated for varactor error currents comprising:
   an input stage including first and second pairs of complementary conductivity type input transistors, each transistor having a base, emitter, and collector, the bases of the first pair of input transistors being connected to form a non-inverting input, the emitters of each of the first pair of input transistors being connected to the base of the second input transistor having opposite conductivity type, the emitters of the second pair of input transistors being connected together to form an inverting input, and the collectors of the second pair of transistors forming a pair of current outputs, the input stage producing a pair of complementary currents at the pair of current outputs in response to a differential voltage applied between the inverting and non-inverting inputs;
   a pair of current sources, each current source being connected to the emitter of one of the first pair of input transistors, for providing biasing current to the first and second pairs of input transistors
   a pair of complementary current mirrors each including an input and an output transistor, each transistor having a base, collector, and emitter, the collector and base of each input transistor being connected together to form an input for the corresponding current mirror and the collector of each output transistor forming an output for the corresponding current mirror, the inputs of each of the current mirrors being coupled to one of the pair of current outputs of the complementary input stage, and the outputs of the pair of complementary current mirrors being connected together to form a gain node for the amplifier circuit;
   a capacitor coupled between the gain node of the amplifier and a reference voltage;

a voltage buffer having an input and an output, the input being coupled to the gain node of the amplifier and the output forming the amplifier circuit output; and a pair of compensating diodes connected, respectively, between the base of one of the transistors of the second pair of input transistors and the emitter of the output transistor of the corresponding current mirror; the compensating diodes being selected to track the magnitude and voltage dependence of the collector-base junctions of the second pair of transistors, for offsetting varactor current errors contributed to the gain node by the second pair of transistors.

7. The amplifier circuit of claim 6, further comprising:

a second voltage buffer having an output and an input connected to the gain node of the amplifier; and a second pair of compensating diodes each being connected between the output of the second voltage buffer and the emitter of one of the output transistors of the complementary pair of current mirrors, the compensating diodes being selected to track the magnitude and voltage dependence of the collector-base junction of the corresponding output transistor, for offsetting varactor error currents contributed to the gain node by the output transistors.

8. An amplifier circuit compensated for varactor error currents, the amplifier circuit comprising:

an input stage including a current source and a pair of differentially connected input transistors, each having a base, collector, and emitter, the bases and collectors of the input transistors forming a pair of differential inputs and a pair of outputs, respectively, with the emitters of the pair of input transistor being connected to the current source;

a gain stage including;

a current mirror having input and output transistors, the input and output transistors each having a base, collector, and emitter, the collectors of the input and output transistors forming the input and output, respectively, of the current mirror;

a pair of current sources; and first and second biased transistors each having a base, collector, and emitter, the bases of the first and second biased transistors being connected to a common bias voltage, the emitters of the first and second biased transistors being connected to one of the current sources, and the collectors of the first and second biased transistors being connected to the collectors of the input and output transistors, respectively, of the current mirror, the collectors of the output transistor and second biased transistor forming a gain node;

a first voltage buffer having an input connected to the gain node and an output forming an output for the amplifier circuit;

a capacitor coupled between the gain node of the amplifier and ground;

a second output buffer having an input connected to the gain node and an output; and a pair of compensating diodes, one of the compensating diodes being connected, between the output of the second voltage buffer and the emitter of the output transistor and the other compensating diode being connected between the output of the second voltage buffer and the emitter of the second biased transistor, the compensating diodes being selected to track the voltage dependence of the collector base junctions of the corresponding output and biased transistors, for offsetting varactor current errors contributed to the gain node by the second pair of transistors.

9. The amplifier circuit of claim 8, wherein the compensating diode connected between the output of the second voltage buffer and the emitter of the output transistor of the current mirror is selected to have a capacitance that tracks the voltage dependence of the collector-base junctions of the input and output transistors of the current mirror.

10. The amplifier circuit of claim 9, wherein the second voltage buffer is adjusted to offset any difference between a voltage at the output of the second voltage buffer and the gain node voltage.

11. An amplifier input stage compensated for varactor error currents comprising:

first and second input transistors, each having a base, collector, and emitter, the bases forming a pair of amplifier inputs and the collectors forming a pair of outputs for the amplifier input stage;

first and second current source transistors, each having a base, collector, and emitter, the emitters being connected to a reference voltage, the bases being connected to a bias voltage, and the collectors being connected to the emitters of the first and second input transistors, respectively, for providing bias current to the first and second input transistors;

a resistor having first and second electrodes connected to the emitters of the first and second input transistors, respectively, for limiting the current in the first and second input transistors;

first and second compensating current source transistors each having a base, collector, and emitter, the bases and emitters being connected to the bias and reference voltages, respectively; and first and second compensating input transistors, each having a base, collector, and emitter, the bases being connected to the bases of the first and second input transistors, respectively, the collectors being connected to the collectors of the second and first input transistors, respectively; and the emitters being connected to the collectors of the first and second compensating current source transistors, respectively, for generating varactor error currents in the first and second compensating input transistors with a voltage applied between the pair of amplifier inputs and coupling these to the collectors of the second and first input transistors, respectively, to offset the varactor error currents generated in the first and second input transistors, respectively.

12. An amplifier circuit compensated for varactor error currents, the amplifier circuit comprising:

an input stage including a current source and a pair of differentially connected input transistors, each having a base, collector, and emitter, the bases and collectors of the input transistors forming a pair of differential inputs and a pair of outputs, respectively, with the emitters of the pair of input transistor being connected to a common current source;

a gain stage including;

a current mirror having input and output transistors, the input and output transistors each having a base, collector, and emitter, the collectors of the input and output transistors forming the input and output, respectively, of the current mirror;

a pair of current sources; and first and second biased transistors each having a base, collector, and emitter, the bases of the first and second biased transistors being connected to a common bias voltage, the emitter of each of the first and second biased transistors being connected to one of the current sources, and the collectors of the first and second biased transistors being connected to the collectors of the input and output transistors, respectively, of the current mirror, the collectors of the output transistor and second biased transistor forming a gain node;

a capacitor coupled between the gain node of the amplifier and ground;

a first voltage buffer having an input connected to the gain node and an output forming an output for the amplifier circuit, the first voltage buffer having an input stage including:

a pair of current sources; and a pair of complementary buffer input transistors, each having a base, collector, and emitter, the bases of the complementary buffer transistors forming the input of the first voltage buffer, the bases being connected together and each of the emitters being connected to one of the current sources to provide bias current to the first voltage buffer;

a first pair of compensating diodes, one of the compensating diodes being connected, between the output of the emitter of one of the complementary buffer input transistors and the emitter of the output transistor and the other compensating diode being connected between the emitter of said one of the complementary buffer input transistors and the emitter of the second biased transistor, the first pair of compensating diodes being selected to track the voltage dependence of the collector base junctions of the corresponding output and biased transistors, for offsetting varactor current errors contributed to the gain node by the second pair of transistors; and a second pair of compensating diodes, one of the second pair of compensating diodes being connected between the emitter of the second biased transistor and the emitter of the other buffer input transistor and the other of the second pair of compensating diodes being connected between the emitter of the current mirror output transistor and the emitter of the other buffer input transistor, for offsetting varactor error currents contributed by input buffer transistors in the first voltage buffer.

13. An input stage for an amplifier circuit that is compensated for varactor error currents, the input stage comprising:

current source means for providing biasing current to the input stage;

first and second input transistors, each of the input transistors having a base, collector, and emitter, the emitters being connected to the current source means to receive bias current, and the bases and collectors of the first and second input transistors forming first and second inputs and first and second outputs, respectively, for the input stage;

a resistor connected between the emitters of the first and second input transistors for limiting current in the input stage; and first and second compensation transistors, each having a base, emitter, and collector with the base-collector junctions of the compensation transistors substantially identical to the base collector junctions of the input transistors, the emitters of the compensation transistors being connected to the current source means and the base and collector of each compensation transistor being connected to the base of one of the input transistors and the collector of the other input transistor, respectively, for replicating varactor error currents generated by the input transistors in the compensation transistors and coupling the replicated varactor error currents to the collectors of the input transistors in a manner that offsets the varactor error currents.

* * * * *